(12) United States Patent
Byun et al.

(10) Patent No.: US 10,111,320 B2
(45) Date of Patent: Oct. 23, 2018

(54) DISPLAY DEVICE

(71) Applicant: Samsung Display Co., Ltd., Yongin-Si, Gyeonggi-Do (KR)

(72) Inventors: Sang-chul Byun, Anyang-si (KR); Hyuk-hwan Kim, Hwaseong-si (KR); Seokhyun Nam, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 155 days.

(21) Appl. No.: 15/195,292

(22) Filed: Jun. 28, 2016

(65) Prior Publication Data

US 2017/0171962 A1 Jun. 15, 2017

(30) Foreign Application Priority Data

Dec. 10, 2015 (KR) .................... 10-2015-0176071

(51) Int. Cl.
*F21V 8/00* (2006.01)
*H05K 1/02* (2006.01)

(52) U.S. Cl.
CPC ......... *H05K 1/0256* (2013.01); *G02B 6/0031* (2013.01); *G02B 6/0055* (2013.01); *G02B 6/0083* (2013.01); *G02B 6/0085* (2013.01); *G02B 6/0088* (2013.01); *H05K 2201/10106* (2013.01); *H05K 2201/10136* (2013.01)

(58) Field of Classification Search
CPC .. H05K 1/0256; G02B 6/0031; G02B 6/0055; G02B 6/0083; G02B 6/0085; G02B 6/0088
See application file for complete search history.

(56) References Cited

U.S. PATENT DOCUMENTS

| | | | |
|---|---|---|---|
| 7,991,257 B1* | 8/2011 | Coleman | B29D 11/0073 264/1.24 |
| 2010/0039828 A1 | 2/2010 | Han et al. | |
| 2016/0170130 A1* | 6/2016 | Jin | G02B 6/0055 349/65 |

FOREIGN PATENT DOCUMENTS

| | | |
|---|---|---|
| JP | 2008021541 A | 1/2008 |
| KR | 100229612 B1 | 8/1999 |
| KR | 1020080067845 A | 7/2008 |
| KR | 1020080081557 A | 9/2008 |
| KR | 1020140008451 A | 1/2014 |

* cited by examiner

*Primary Examiner* — Anabel Ton
(74) *Attorney, Agent, or Firm* — Cantor Colburn LLP

(57) ABSTRACT

A display device includes a light source unit, a light guide plate including a light incident surface, an opposite surface, a light exit surface, and a light exit rear surface, a display panel provided on the light exit surface, a bottom chassis for housing the light guide plate, and an anti-static electricity member including a fluoride resin and contacting the bottom chassis, where the bottom chassis includes a bottom section and a sidewall section perpendicularly connected from the bottom section, and the sidewall section includes a first sidewall section more adjacent close to the light incident surface than the opposite surface, a second sidewall section, a third sidewall section, and the fourth sidewall section, and the anti-static electricity member is provided between the first sidewall section and the light source unit and contacting at least a portion of the first sidewall section.

16 Claims, 13 Drawing Sheets

DISPLAY DEVICE

This application claims priority to priority to Korean Patent Application No. 10-2015-0176071, filed on Dec. 10, 2015, the content of which in its entirety is herein incorporated by reference.

BACKGROUND

1. Field

Exemplary embodiments of the invention herein relate to a display device, and more particularly, to a display device including a light source unit, a light guide plate, and a display panel.

2. Description of the Related Art

As display devices are currently known, such devices include a liquid crystal display ("LCD"), a plasma display panel ("PDP"), an organic light emitting display ("OLED"), a field effect display ("FED"), an electrophoretic display ("EPD"), and the like.

The LCD device widely used in various electronic devices such as a television ("TV"), a portable apparatus, a monitor, or the like includes a liquid crystal panel, which has two substrates facing each other and a liquid crystal layer disposed therebetween so as to implement an image.

Since the LCD device is a passive display device that may not emit light by itself, a backlight unit including a light source for supplying light is provided on the rear surface of the LCD panel. The LCD device includes a bottom chassis for housing the backlight unit.

SUMMARY

Defects may occur due to electrostatic discharge ("ESD") between the bottom chassis and the backlight unit, leading to defects in the liquid crystal display device. Studies on structures which may prevent the defects caused by the ESD have been continuously in demand.

The invention provides a display device capable of preventing occurrences of defects due to ESD.

The invention also provides a display device having excellent chemical resistance properties, heat resistance properties, insulation properties, and waterproof properties, thus improving reliability.

An exemplary embodiment of the invention provides a display device including a light source unit, a light guide plate including a light incident surface for receiving light from the light source unit, an opposite surface facing the light incident surface, a light exit surface which connects the light incident surface and the opposite surface to each other, and a light exit rear surface facing the light exit surface, a display panel provided on the light exit surface, a bottom chassis for housing the light guide plate therein, and an anti-static electricity member including a fluoride resin and contacting the bottom chassis, where the bottom chassis includes a bottom section and a sidewall section perpendicularly connected from the bottom section, the sidewall section includes a first sidewall section more adjacent to the light incident surface than the opposite surface, a second sidewall section facing the first sidewall section, a third sidewall section which connects the first and second sidewall sections to each other, and a fourth sidewall section facing the third sidewall section, and the anti-static electricity member is provided between the first sidewall section and the light source unit and contacting at least a portion of the first sidewall section.

In an exemplary embodiment, the fluoride resin may include one of including polytetrafluoroethylene ("PTFE"), perfluoroalkoxy ("PFA"), fluorinated ethylene propylene ("FEP"), ethylene tetrafluoroethylene ("ETFE"), ethylene-chlorotrifluoroethylene ("ECTFE"), and any combination thereof, for example.

In an exemplary embodiment, the first sidewall section may include a first inner side surface on which the anti-static electricity member is provided, and the first inner side surface may not be exposed to an outside by the anti-static electricity member.

In an exemplary embodiment, the anti-static electricity member may include a first sub-anti-static electricity member contacting the at least the portion of the first sidewall section, and a second sub-anti-static electricity member contacting at least a portion of the bottom section.

In an exemplary embodiment, the first and second sub-anti-static electricity members may be unitary.

In an exemplary embodiment, the light source unit may include a printed circuit board and a light source provided on the printed circuit board, where the printed circuit board is provided on the bottom section, and the second sub-anti-static electricity member is provided between the bottom section and the printed circuit board, and contacts each of the bottom section and the printed circuit board.

In an exemplary embodiment, the bottom chassis may further include a cover section which perpendicularly extends from the first sidewall section and is opposed to the bottom section.

In an exemplary embodiment, the cover section may overlap a portion of the bottom section when viewed in a plane.

In an exemplary embodiment, the anti-static electricity member may include a first sub-anti-static electricity member contacting the at least the portion of the first sidewall section, a second sub-anti-static electricity member contacting at least a portion of the bottom section, and a third sub-anti-static electricity member contacting at least a portion of the cover section.

In an exemplary embodiment, the first, second, and third sub-anti-static electricity members may be unitary.

In an exemplary embodiment, the anti-static electricity member may include an adhesive layer contacting at least a portion of the first sidewall section, a metal layer spaced apart from the first sidewall section and contacting the adhesive layer, and a fluoride resin layer including a fluoride resin and contacting the metal layer.

In an exemplary embodiment, the light source unit may include a printed circuit board and a light source provided on the printed circuit board, and the printed circuit board contacts the bottom section.

In an exemplary embodiment, one end of the printed circuit board may contact a portion of the fluoride resin layer.

In an exemplary embodiment, the anti-static electricity member may be spaced apart from the second sidewall section.

In an exemplary embodiment, thickness of the anti-static electricity member may have a thickness in a range from about 50 micrometers (μm) to about 70 μm.

In an exemplary embodiment, the bottom chassis may include a conductive material.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain principles of the invention. In the drawings.

DETAILED DESCRIPTION

Figure 1A:
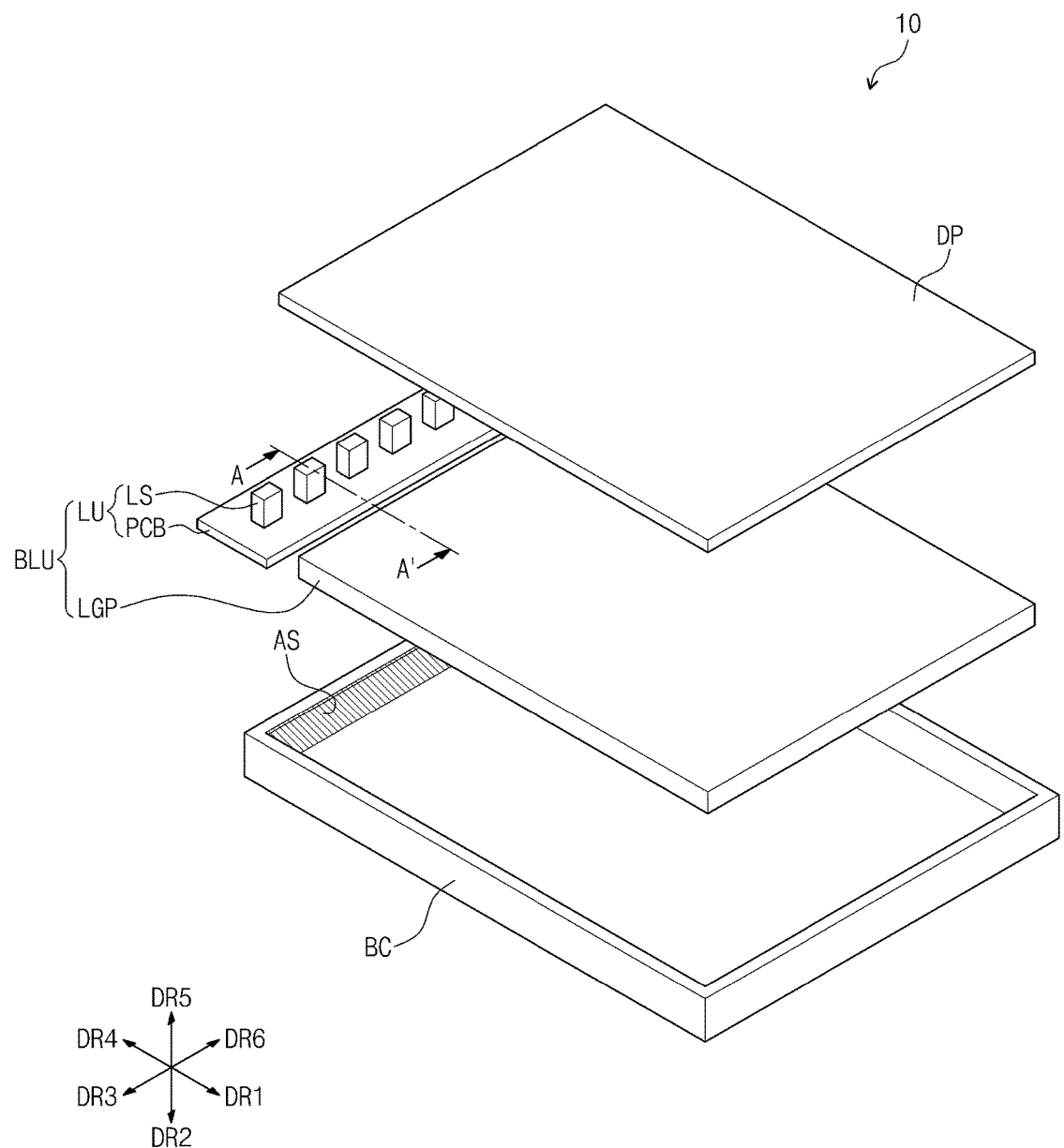
FIG. 1A is an exploded perspective view illustrating a display device according to an exemplary embodiment of the invention.

Objectives, other objectives, features, and advantages of the invention will be clarified through the following embodiments described with reference to the accompanying drawings. The invention may, however, be embodied in different forms and should not be construed as limited to the embodiments set forth herein. Rather, these embodiments are provided so that this invention will be thorough and complete, and will fully convey the scope of the invention to those skilled in the art.

Like reference numerals denote like elements throughout. In the drawings, the dimensions of structures are exaggerated for clarity. Although terms like a first, a second, a third, and a fourth are used to describe various elements, components, and/or sections in various embodiments of the invention, the elements, components, and/or sections should not be limited thereto. These terms are used only to differentiate one element, component, or section from another one. In an exemplary embodiment, a first element may be termed a second element, and similarly, a second element may be termed a first element, without departing from the scope of technical idea of the invention. As used herein, the singular forms "a", "an", and "the" are intended to include the plural forms as well, unless the context clearly indicates otherwise.

Herein, it should be understood that the meaning of "include", "comprise", "including", "comprising", "have", or "having" specifies a characteristic, a fixed number, a step, a process, an element, a component and/or a combination thereof, but does not exclude the presence of or the possibility of adding other properties, fixed numbers, steps, processes, elements, components and/or combinations thereof. It will also be understood that when a layer, a film, a region, or a substrate is referred to as being "on" another one, it can be directly on the other one, or one or more intervening ones may also be present. To the contrary, when a layer, a film, a region, or a substrate is referred to as being "under" another one, it can be directly under the other one, or one or more intervening ones may also be present.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an exemplary embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an exemplary embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, a display device according to exemplary embodiments of the invention will be described in detail with reference to FIGS. 1A to 6B.

FIG. 1A is an exploded perspective view illustrating a display device according to an exemplary embodiment of the invention.

Referring to FIG. 1A, a display device 10 according to an exemplary embodiment of the invention includes a display panel DP, a backlight unit BLU, a bottom chassis BC, and an anti-static electricity member AS contacting the bottom chassis BC.

The anti-static electricity member AS may be fully provided inside the bottom chassis BC, or may be provided to a specific portion inside the bottom chassis BC. This will be described in detail below.

The backlight unit BLU includes a light source unit LU and a light guide plate LGP. The light source unit LU provides light to the display panel DP. In an exemplary embodiment, the light source unit LU may provide, for example, a white light. The light source unit LU includes a printed circuit board PCB and a light source LS provided on the printed circuit board PCB. The printed circuit board PCB functions to supply power to the light source LS. In an exemplary embodiment, the light source LS may be a light emitting diode ("LED"), for example. The light source LS may be provided in plurality, and the plurality of light sources may be disposed spaced apart on the printed circuit board PCB in a predetermined direction DR3 or DR6 of FIG. 1. In an exemplary embodiment, the light source unit LU included in the display device 10 according to an exemplary embodiment of the invention may be an LED chip or an LED package, for example.

The backlight unit BLU is divided into a direct type and an edge type according to the location of the light source LS. Specifically, the direct type is a type in which the light source LS is disposed under the display panel DP to directly supply light emitted from the light source LS to the display panel DP, whereas the edge type is a type in which the light guide plate LGP is disposed under the display panel DP and the light source LS is disposed on one side of the light guide plate LGP to indirectly supply the light emitted from the light source LS, deflected and reflected by the light guide plate LGP, to the display panel DP.

The display device 10 according to an exemplary embodiment of the invention is the edge type display device having the light source LS provided to one side of the light guide plate LGP. The edge type has advantages in realizing thickness reduction when compared with the direct type. The light source LS may be spaced apart from the light guide plate LGP in a fourth direction DR4 of FIG. 1.

Figure 1B:
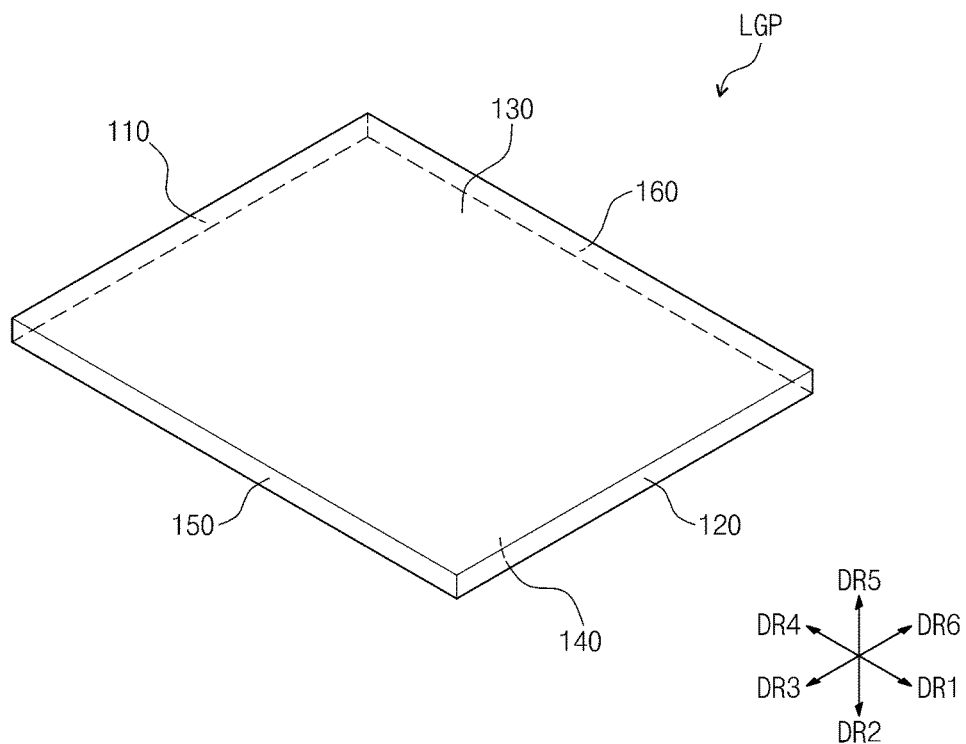
FIG. 1B is a view specifically illustrating the light guide plate of FIG. 1A.

FIG. 1B is a view specifically illustrating the light guide plate of FIG. 1A.

Referring to FIG. 1B, the light guide plate LGP includes a light incident surface 110, an opposite surface 120, a light exit surface 130, a light exit rear surface 140, a first side surface 150, and a second side surface 160. The light incident surface 110 is the surface receiving light from the light source unit LU (refer to FIG. 1A). The opposite surface 120 is opposed to the light incident surface 110. The opposite surface 120 is spaced apart from the light incident surface 110 in a first direction DR1. The light exit surface 130 connects one end of the light incidents surface 110 and one end of the opposite surface 120 to each other. The light provided from the light source unit LU exits through the light exit surface 130, and is provided to the display panel DP (refer to FIG. 1A). The light exit rear surface 140 is opposed to the light exit surface 130. The light exit rear surface 140 connects another end of the light incident surface 110 and another end of the opposite surface 120 to each other. The light exit rear surface 140 is spaced apart from the light exit surface 130 in a second direction DR2. The first side surface 150 connects one end of the light exit surface 130 and one end of the light exit rear surface 140 to each other. The second side surface 160 connects another end of the light exit surface 130 and another end of the light exit rear surface 140 to each other. The second side surface 160 is opposed to the first side surface 150. The second side surface 160 is spaced apart from the first side surface 150 in a sixth direction DR6.

Referring to FIGS. 1A and 1B, the display panel DP is provided on the light exit surface 130 of the light guide plate LGP. In exemplary embodiments, various display panels such as a liquid crystal display panel ("LCD"), an electrophoretic display panel ("EDP"), and the like may be used for the display panel DP. Hereinafter, it will be exemplified that an LCD panel is used as the display panel DP.

Figure 1C:
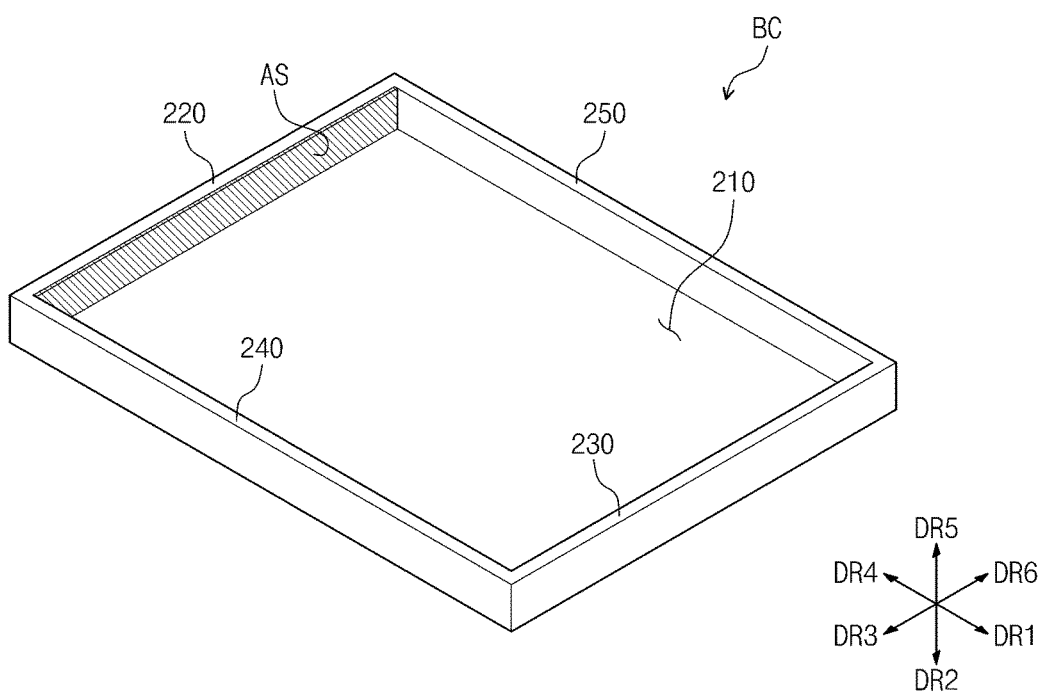
FIG. 1C is a view specifically illustrating the bottom chassis of FIG. 1A.

FIG. 1C is a view specifically illustrating the bottom chassis of FIG. 1A.

Referring to FIGS. 1A and 1C, the bottom chassis BC houses the backlight unit BLU. The bottom chassis BC houses the light guide plate LGP inside thereof. The bottom chassis BC houses the light source unit LU inside thereof.

The bottom chassis BC includes a bottom section 210 and sidewall sections 220, 230, 240, and 250 perpendicularly connected to the bottom section 210. The sidewall sections 220, 230, 240, and 250 are connected to the bottom section 210 in a fifth direction DR5. The backlight unit BLU is disposed (e.g., mounted) on the bottom section 210, and the sidewall sections 220, 230, 240, and 250 cover the backlight unit BLU.

The sidewall sections 220, 230, 240, and 250 include a first sidewall section 220, a second sidewall section 230, a third sidewall section 240, and a fourth sidewall section 250. The first sidewall section 220 is more adjacent to the light incident surface 110 than to the opposite surface 120. The second sidewall section 230 is opposed to the first sidewall section 220. The second sidewall section 230 is spaced apart from the first sidewall section 220 in the first direction DR1. The second sidewall section 230 is more adjacent to the opposite surface 120 than to the light incident surface 110. The third sidewall section 240 connects one end of the first sidewall section 220 and one end of the second sidewall section 230 to each other. The fourth sidewall section 250 connects the other end of the first sidewall section 220 and the second sidewall section 230 to each other. The fourth sidewall section 250 is spaced apart from the third sidewall section 240 in the sixth direction DR6.

The bottom chassis BC may include a conductive material. In an exemplary embodiment, the bottom chassis BC may include a metallic material including, for example, stainless steel ("SUS"), galvalume, or aluminum, plastic or the like, but is not limited to those set forth herein. In an exemplary embodiment, the bottom chassis BC includes a material having excellent conductivity as well as excellent heat conductivity. The bottom chassis BC may include a metal having excellent conductivity as well as excellent heat conductivity. Heat radiation through the bottom chassis BC may be realized by including a material having excellent heat conductivity in the bottom chassis BC. The heat radiation through the bottom chassis BC may prevent occurrence of defects due to damage caused by heat of the light source unit LU and yield decrease caused by the defects.

The anti-static electricity member AS functions to prevent occurrence of defects due to an electrostatic discharge ("ESD") generated between the bottom chassis BC and the light source unit LU. Particularly, the anti-static electricity member AS functions to basically block the occurrence of the defects due to the ESD which may occur when the printed circuit board PCB and the bottom chassis BC contact each other. Particularly, when the bottom chassis BC includes a conductive material, the ESD prevention effect according to the anti-static electricity member AS becomes outstanding.

The anti-static electricity member AS includes a fluoride resin having excellent insulation properties in order to properly function as above. In an exemplary embodiment, the fluoride resin may include one of polytetrafluoroethylene ("PTFE"), perfluoroalkoxy ("PFA"), fluorinated ethylene propylene ("FEP"), ethylene tetrafluoroethylene ("ETFE"), ethylene-chlorotrifluoroethylene ("ECTFE"), and any combination thereof, for example. However, the fluoride resin is not limited to those set forth herein, and any fluoride resin may be employed without any limitation as long as it has excellent insulation properties capable of effectively preventing the occurrence of static electricity between the printed circuit board PCB and the bottom chassis BC. In an exemplary embodiment, the anti-static electricity member AS may be provided by, for example, coating Teflon on the bottom chassis BC.

The fluoride resin has advantage in which chemical resistance properties, heat resistance properties, and waterproofing properties as well as insulation properties are excellent. It is also advantageous that reliability of the display device 10 according to an exemplary embodiment of the invention is enhanced by providing the anti-static electricity member AS including the fluoride resin contacting the bottom chassis BC.

In an exemplary embodiment, the anti-static electricity member AS including the fluoride resin may be coated on the bottom chassis BC using, for example, a general fluoride resin coating method, for example. In an exemplary embodiment, the anti-static electricity member AS including the fluoride resin may contact the bottom chassis BC by using a conventional spray, electrostatic spray, dip-spin, coil coating, roller coating or arc spray, for example, but not limited thereto.

The anti-static electricity member AS may contact the bottom chassis BC in an one-coat, two-coat, three-coat, or multiple-coat form according to a desired thickness.

In an exemplary embodiment, the thickness (e.g., t1 of FIG. 2A) of the anti-static electricity member AS taken along the first or fourth direction DR1 or DR4 may be in a range from approximately 50 micrometers (μm) to approximately 70 μm, from approximately 50 μm to approximately 65 μm, from approximately 55 μm to approximately 70 μm, or from approximately 55 μm to approximately 65 μm, for example, but not limited thereto. When the thickness of the anti-static electricity member AS is less than 50 μm, an insulation effect is insufficient, and thus the function of preventing occurrence of defects due to ESD may not be effectively performed, and when the thickness exceeds 70 μm, the display device is disadvantageous in failing to meet the slimness trend of display devices.

Figure 2A:
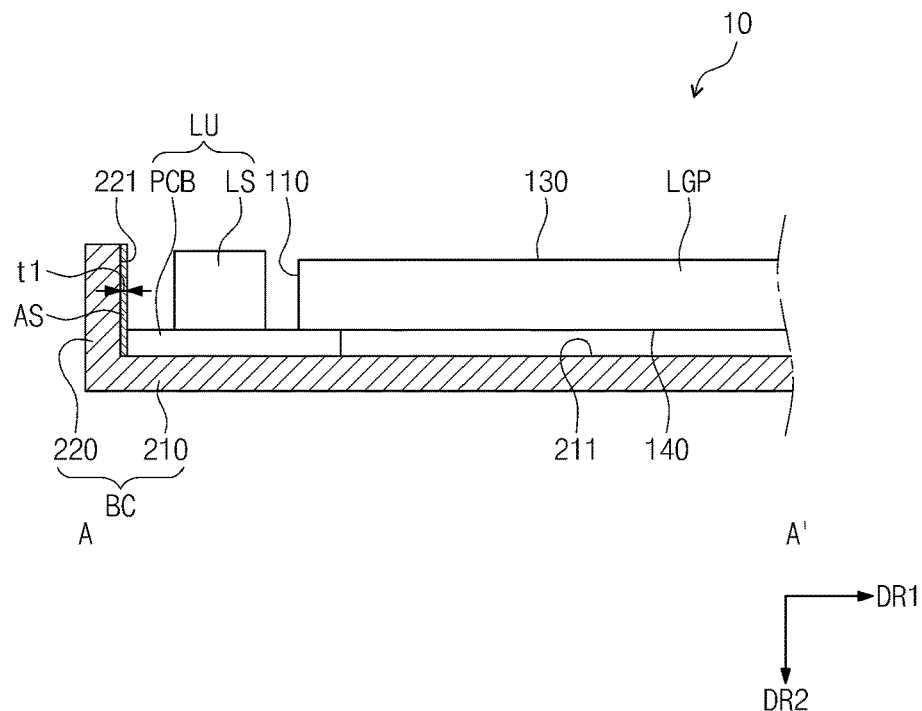
FIG. 2A is a cross-sectional view taken along line A-A' of FIG. 1A.

FIG. 2A is a cross-sectional view taken along line A-A' of FIG. 1A.

Referring to FIGS. 1A to 1C, and 2A, the anti-static electricity member AS may be provided between the first sidewall section 220 and the light source unit LU, and may contact at least a portion of the first sidewall section 220.

The first sidewall section 220 includes a first inner side surface 221 in which the anti-static electricity member is provided, and at least a portion of the first inner side surface 221 contacts the anti-static electricity member AS. The first inner side surface 221 may not be exposed to the outside by the anti-static electricity member AS. In an exemplary embodiment, the anti-static electricity member AS may fully contact the first inner side surface 221. Although not illustrated, in another exemplary embodiment, a portion of the first inner side surface 221 may be exposed to the outside. In this case, the anti-static electricity member AS may be provided to a region of the first inner side surface 221 adjacent to the bottom section 210.

The anti-static electricity member AS is spaced apart from the second sidewall section 230. Since the display device 10 according to an exemplary embodiment of the invention includes the anti-static electricity member AS to prevent occurrence of defects due to ESD generated between the light source unit LU and the bottom chassis BC, unnecessary use of a material may be avoided by not providing the anti-static electricity member AS to the second sidewall section 230 to which the light source unit LU is not provided. The light source unit LU is not provided between the second sidewall section 230 of the bottom chassis BC and the opposite surface 120 of the light guide plate LGP.

When the third sidewall section 240 is viewed in the direction DR6 from the third sidewall section 240 to the fourth sidewall section 250, the third sidewall section 240 may be divided into an overlapping area (not illustrated) which overlaps the light source unit LU and a non-overlapping area (not illustrated) which does not overlap the light source unit LU. The anti-static electricity member AS may be spaced apart from the non-overlapping area (not illustrated) of the third sidewall section 240. Since the anti-static electricity member AS is provided to insulate the static electricity generated between the light source unit LU and the bottom chassis BC, it is advantageous that unnecessary use of a material may be reduced by not providing the anti-static electricity member AS to an area which is not adjacent to the light source unit LU. When the first inner side surface 221 is not exposed to the outside by the anti-static electricity member AS, a portion of the third sidewall section 240 contacting the first sidewall section 220 contacts the anti-static electricity member AS by the thickness of the anti-static electricity member AS taken along the first or fourth direction DR1 or DR4. The anti-static electricity member AS may not be provided to the third sidewall section 240 except for the portion contacting the anti-static electricity member AS provided to the first sidewall section 220.

When the fourth sidewall section 250 is viewed in the direction DR3 from the fourth sidewall section 250 to the third sidewall section 240, the fourth sidewall section 250 may be divided into an overlapping area (not illustrated) in which the fourth sidewall section 250 overlaps the light source unit LU and a non-overlapping area (not illustrated) in which the fourth sidewall section 250 does not overlap the light source unit LU. The anti-static electricity member AS may be spaced apart from the non-overlapping area (not illustrated) of the fourth sidewall section 250. Since the anti-static electricity member AS is provided to insulate the static electricity generated between the light source unit LU and the bottom chassis BC, it is advantageous that unnecessary use of a material may be reduced by not providing the anti-static electricity member AS to an area which is not adjacent to the light source unit LU. When the first inner side surface 221 is not exposed to the outside by the anti-static electricity member AS, a portion of the fourth sidewall section 250 contacting the first sidewall section 220 contacts the anti-static electricity member AS by the thickness of the anti-static electricity member AS taken along the first or fourth direction DR1 or DR4. The anti-static electricity member AS may not be provided to the fourth sidewall section 250 except for the portion contacting the anti-static electricity member AS provided to the first sidewall section 220.

Figure 2B:
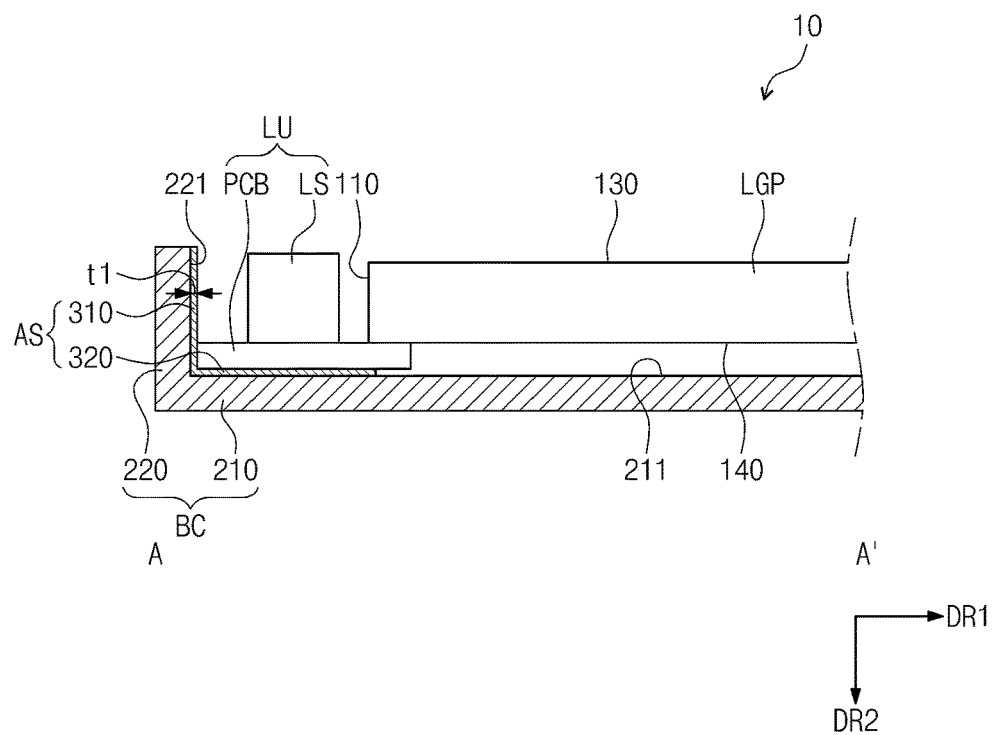
FIG. 2B is a cross-sectional view illustrating a modified example of FIG. 2A.
Figure 2C:
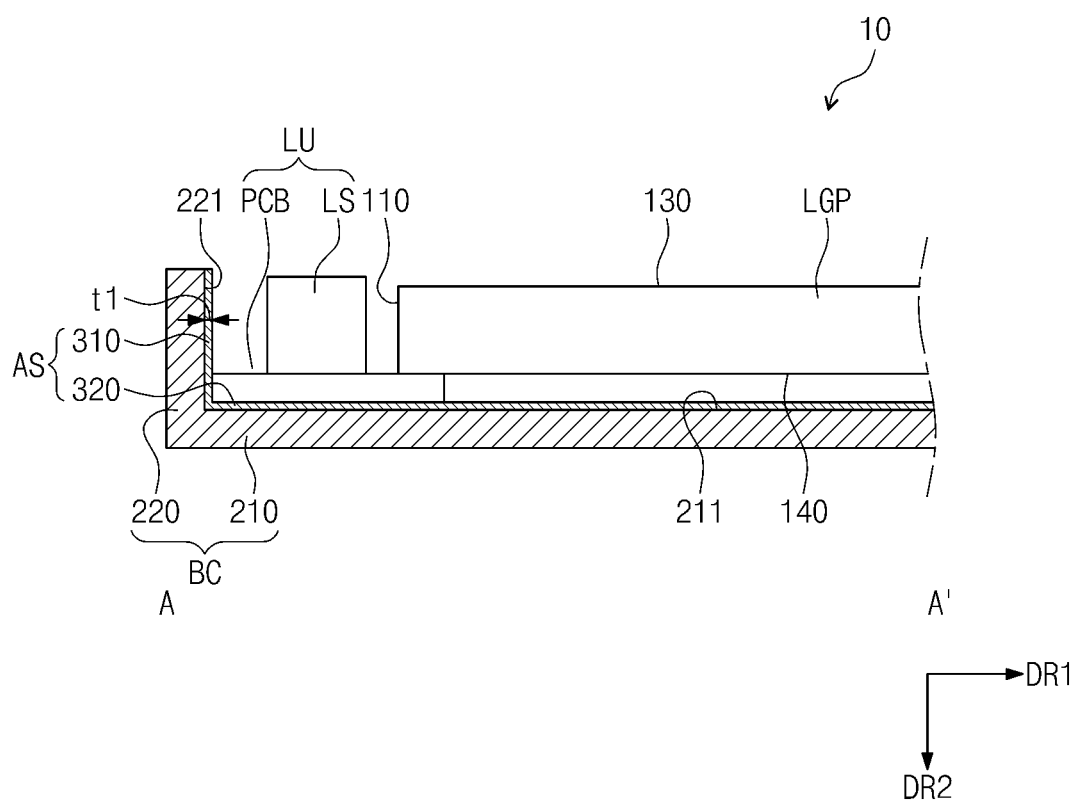
FIG. 2C is a cross-sectional view illustrating a modified example of FIG. 2A.

FIG. 2B is a cross sectional-view illustrating a modified example of FIG. 2A. FIG. 2C is a cross-sectional view illustrating a modified example of FIG. 2A.

Referring to FIGS. 2B and 2C, the anti-static electricity member AS may include a first sub-anti-static electricity member 310 and a second sub-anti-static electricity member 320. The first sub-anti-static electricity member 310 may contact at least a portion of the first sidewall section 220. The first inner side surface 221 of the first sidewall section 220 may not be exposed to the outside by the first sub-anti-static electricity member 310.

The anti-static electricity member AS may be additionally provided to the bottom section 210 of the bottom chassis BC. The bottom section 210 includes a bottom surface 211 on which the anti-static electricity member AS is provided. The second sub-anti-static electricity member 320 may contact the bottom surface 211 of the bottom section 210. The bottom surface 211 may be divided into an area (not illustrated) in which the second sub-anti-static electricity member 320 is provided and an area (not illustrated) in which the second sub-anti-static electricity member 320 is not provided, for example, but is not limited thereto. However, referring to FIG. 2C, the bottom surface 211 may not be exposed to the outside by the second sub-anti-static electricity member 320.

The first sub-anti-static electricity member 310 and the second sub-anti-static electricity member 320 may be unitary. The first sub-anti-static electricity member 310 and the second sub-anti-static electricity member 320 may be integrally connected to each other.

The printed circuit board PCB included in the light source unit LU may be provided on the bottom section 210, but not limited thereto. In an exemplary embodiment, the printed circuit board PCB included in the light source unit may be provided on the first sidewall section 220, for example. It is advantageous in realizing the slimness of the display device 10 that the printed circuit board PCB is provided on the bottom section 210 not on the first sidewall section 220.

A portion of the printed circuit board PCB and a portion of the light guide plate LGP may overlap each other when viewed in a plane. Herein, terms of "in a plane" may mean when the display device 10 according to an exemplary embodiment of the invention is viewed in the thickness direction DR2. Although it is illustrated in FIGS. 2B and 2C that a portion of the printed circuit board PCB contacts the portion of light guide plate LGP, the exemplary embodiment of the invention is not limited thereto. In an exemplary embodiment, the portion of the printed circuit board PCB and the portion of the light guide plate LGP may be connected to each other by an adhesive tape (not illustrated), for example. The portion of the printed circuit board PCB and the portion of the light guide plate LGP may be fixed by interposing the adhesive tape (not illustrated) therebetween.

Although not illustrated, the printed circuit board PCB and the light guide plate LGP may not overlap each other when viewed in a plane.

When the printed circuit board PCB is provided on the bottom section 210, the second sub-anti-static electricity member 320 is provided between the bottom section 210 and the printed circuit board PCB. The second sub-anti-static electricity member 320 may contact each of the bottom section 210 and the printed circuit board PCB. The defects caused by the ESD may be basically prevented by providing the second sub-anti-static electricity member 320 having excellent insulation properties between the bottom section 210 and the printed circuit board PCB such that the second sub-anti-static electricity member 320 contacts each of the bottom section 210 and the printed circuit board PCB.

Figure 3A:
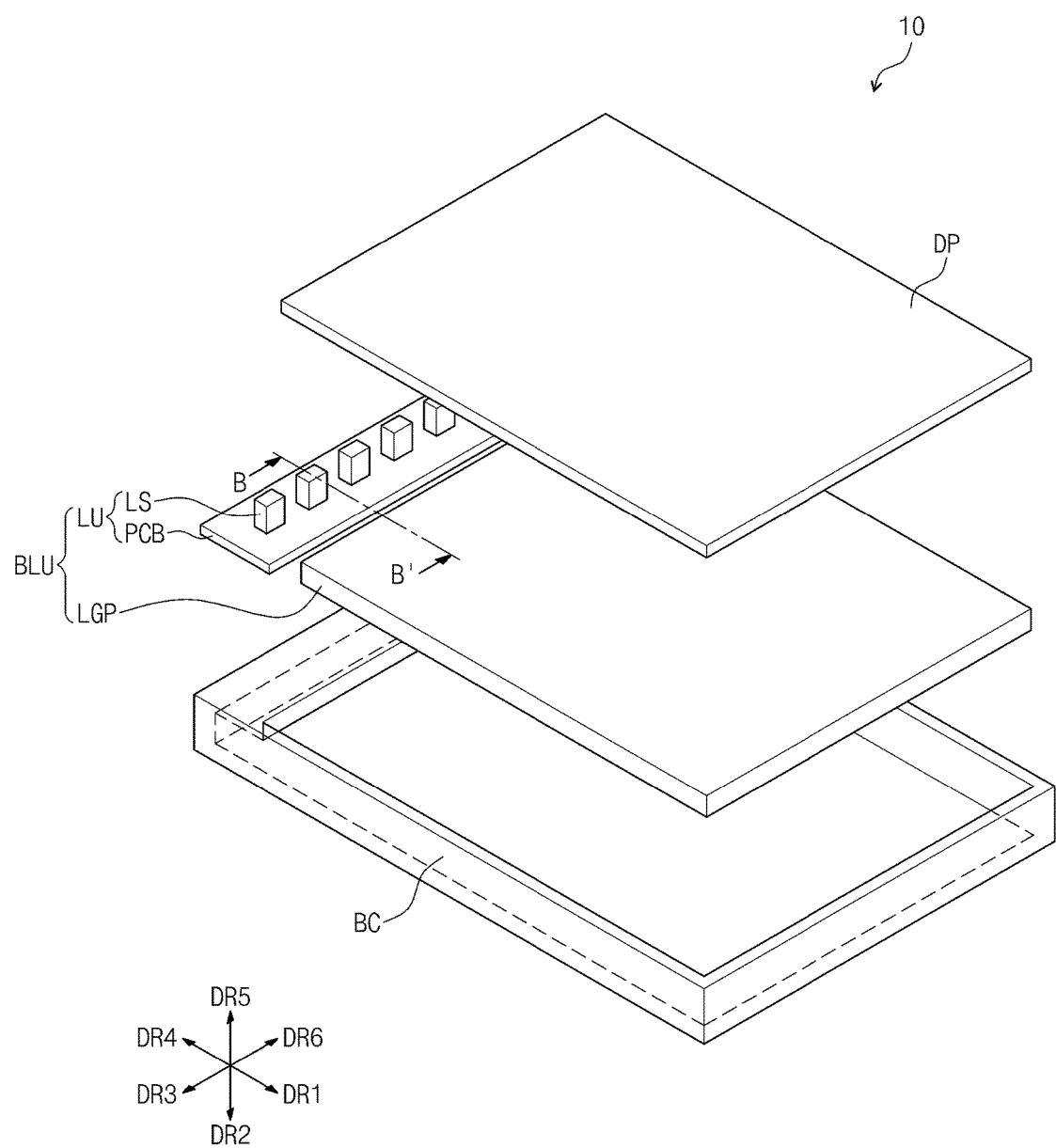
FIG. 3A a perspective view illustrating an exemplary embodiment of a display device according to the invention.
Figure 3B:
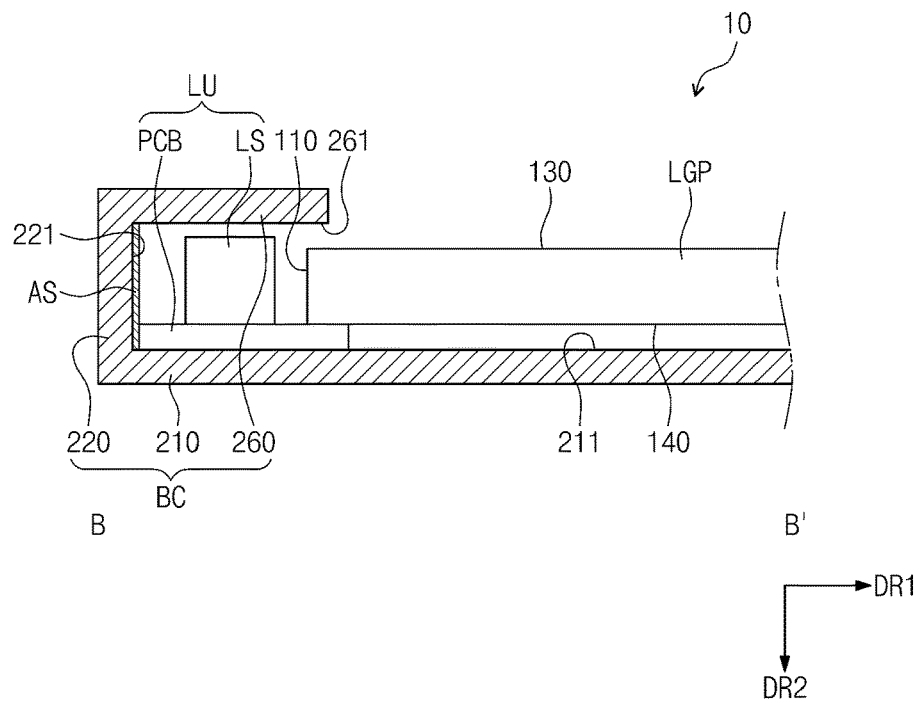
FIG. 3B is a cross-sectional view taken along line B-B' of FIG. 3A.
Figure 3C:
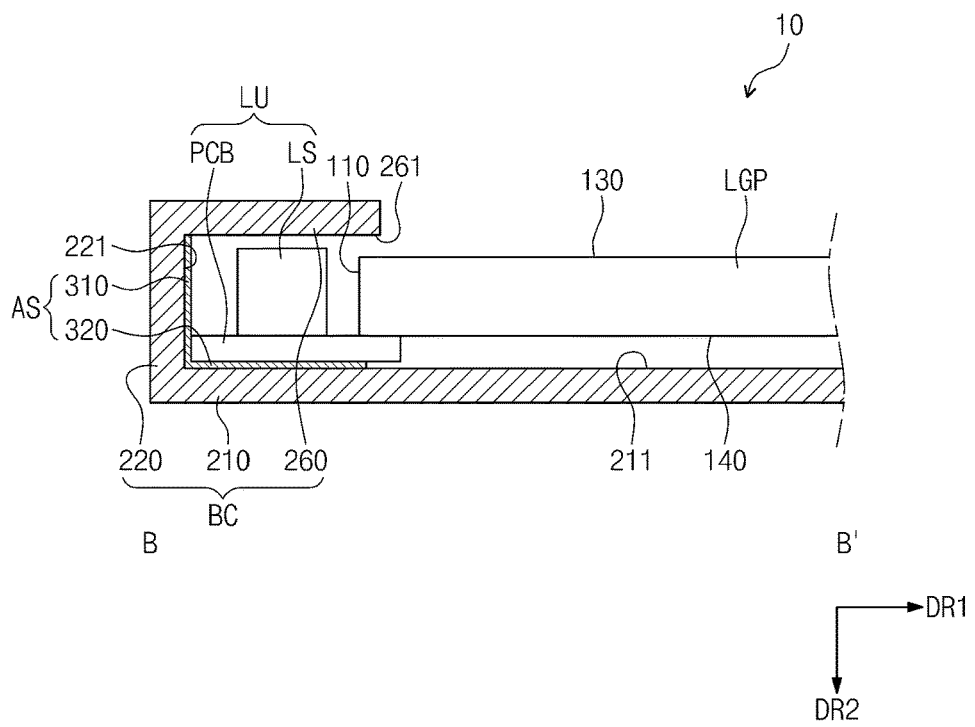
FIG. 3C is a cross-sectional view illustrating a modified example of FIG. 3B.

FIG. 3A is a perspective view illustrating a display device according to an exemplary embodiment of the invention. FIG. 3B is a cross-sectional view taken along line B-B' of FIG. 3A. FIG. 3C is a cross-sectional view illustrating a modified example of FIG. 3B.

Referring to FIGS. 3A, 3B, and 3C, a bottom chassis BC may further include a cover section 260 which perpendicularly extends from a first sidewall section 220 and is opposed to a bottom section 210. A cross section of the bottom chassis BC may have a shape of three consecutive sides of a rectangular.

A light source unit LU and a portion of a light guide plate LGP may be provided in a space defined by the cover section 260. The light source unit LU and the light guide plate LGP may be more effectively covered and housed by the cover section 260. The cover section 260 may also serve to support a display panel DP provided on a backlight unit BLU (refer to FIGS. 6A and 6B). However, the exemplary embodiment of the invention is not limited thereto. In another exemplary embodiment, the bottom chassis BC may not include the cover section 260, and may include a separate mold frame (not illustrated) for supporting the display panel DP.

The mold frame may be provided along edges of the display panel DP to support the display panel DP from a lower portion of the display panel DP.

The cover section 260 may overlap a portion of the bottom section 210 when viewed in a plane. When viewed in a plane, the bottom section 210 is divided into an overlapping area (not illustrated) overlapping the cover section 260 and a non-overlapping area (not illustrated) not overlapping the cover section 260.

Referring to FIG. 3B, although the bottom chassis BC includes the cover section 260, an anti-static electricity member AS may contact only the first sidewall section 220. A first inner side surface 221 may not be exposed to the outside by the anti-static electricity member AS. As described above, although not illustrated, a portion of the first inner side surface 221 may be exposed to the outside.

Referring to FIG. 3C, the anti-static electricity member AS may include a first sub-anti-static electricity member 310 contacting at least a portion of the first sidewall section 220 and a second sub-anti-static electricity member 320 contacting at least a portion of the bottom section 210. The first and second sub-anti-static electricity members 310 and 320 may be unitary.

Figure 3D:
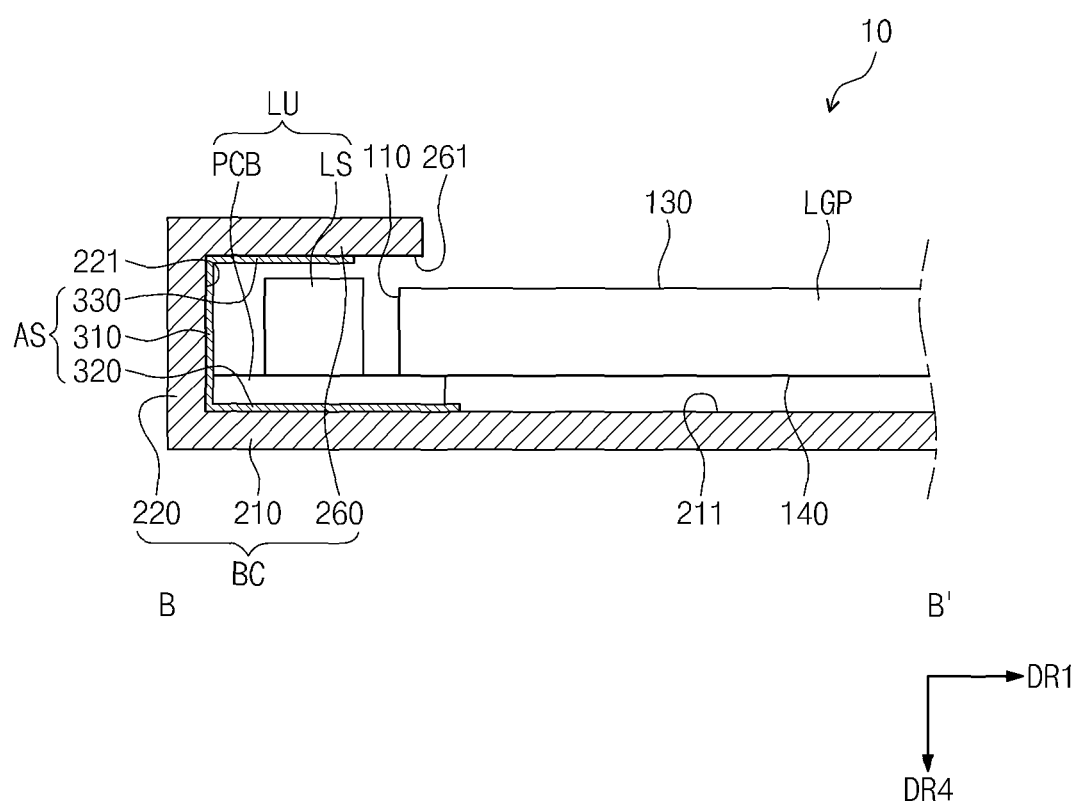
FIG. 3D is a cross-sectional view illustrating a modified example of FIG. 3B.

FIG. 3D is a cross-sectional view illustrating a modified example of FIG. 3B.

Referring to FIG. 3D, an anti-static electricity member AS may further include a third sub-anti-static electricity member 330 contacting at least a portion of a cover section 260. The cover section 260 may include a cover surface 261 connected to a first inner side surface 221, parallel to a bottom surface 221, and opposed to the bottom surface 211. The third sub-anti-static electricity member 330 contacts at least a portion of the cover surface 261. A portion of the cover surface 261 may be exposed to the outside. Although not illustrated, in another exemplary embodiment, the cover surface 261 may not be exposed to the outside by the third sub-anti-static electricity member 330.

When the anti-static electricity member AS includes first and second sub-anti-static electricity members 310 and 320, the first and second sub-anti-static electricity members 310 and 320 may be unitary.

When the anti-static electricity member AS includes the first, second, and third sub-anti-static electricity members 310, 320, and 330, the first, second, and third sub-anti-static electricity members 310, 320, and 330 may be unitary.

Although the anti-static electricity member AS may contact the bottom chassis BC by coating as described above, the exemplary embodiment of the invention is not limited thereto. In an exemplary embodiment, the anti-static electricity member AS may be bonded to the bottom chassis BC after being formed in a bar shape, for example.

Figure 4A:
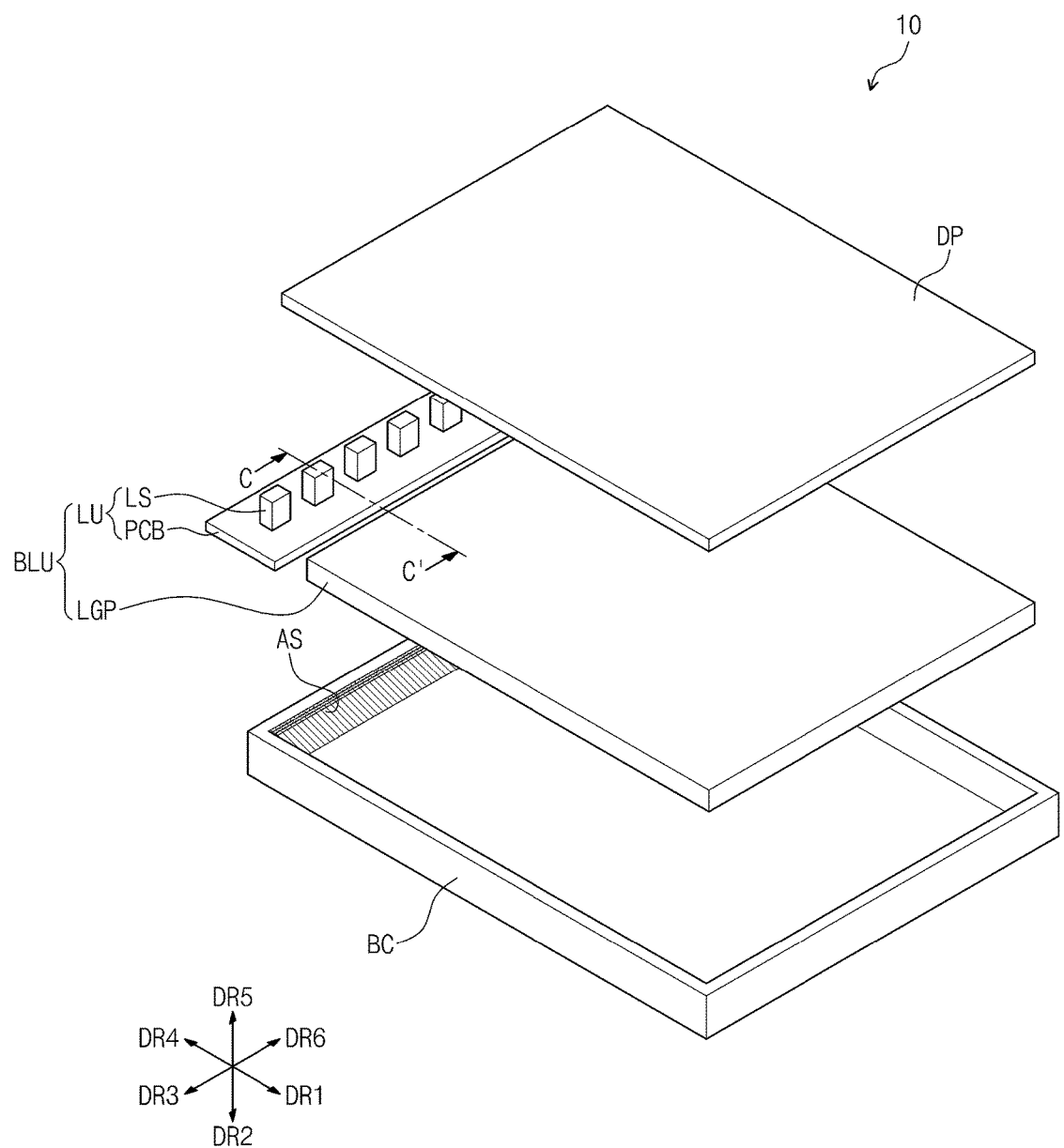
FIG. 4A is a perspective view illustrating an exemplary embodiment of a display device according to the invention.
Figure 4B:
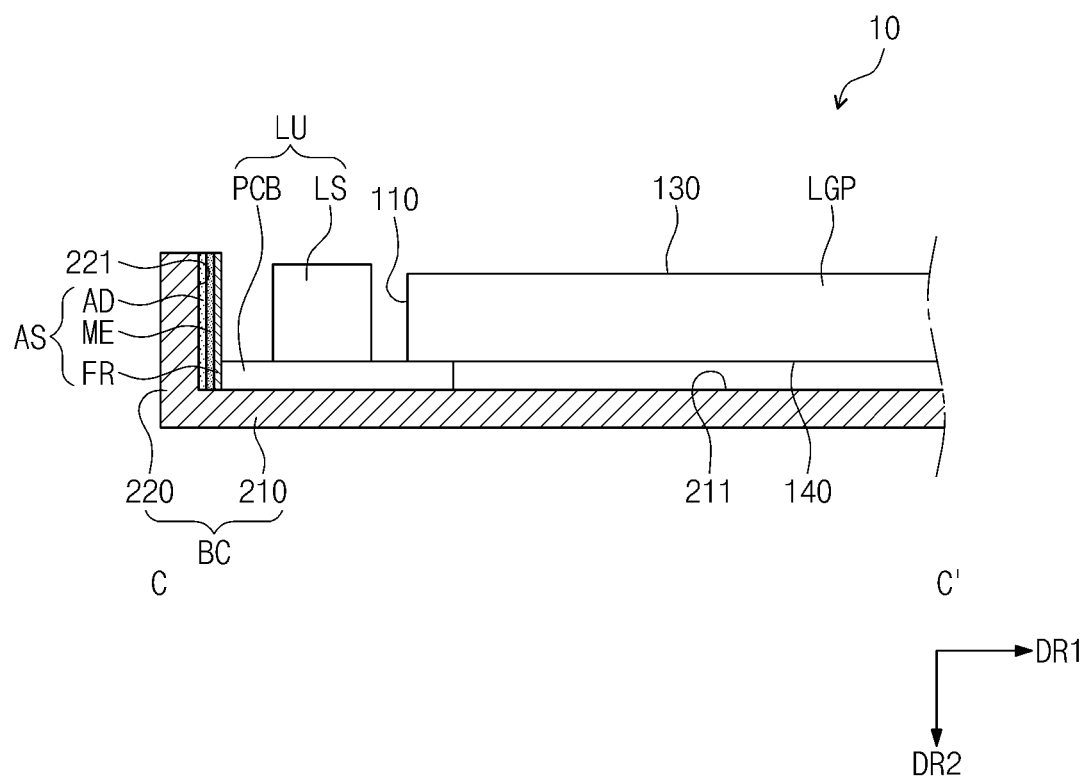
FIG. 4B is a cross-sectional view taken along line C-C' of FIG. 4A.

FIG. 4A is a perspective view illustrating a display device according to an exemplary embodiment of the invention. FIG. 4B is a cross-sectional view taken along line C-C' of FIG. 4A.

Referring to FIGS. 4A and 4B, an anti-static electricity member AS may include an adhesive layer AD, a metal layer ME, and a fluoride resin layer FR.

The adhesive layer AD may contact at least a portion of a first sidewall section 220. Particularly, the adhesive layer AD of the anti-static electricity member AS may contact at least a portion of a first inner side surface 221 of the first sidewall section 220. As an adhesive material included in the adhesive layer AD, any adhesive material may be used without limitation as long as it is a general adhesive material known in the art.

The metal layer ME may be spaced apart from the first sidewall section 220 and contact the adhesive layer AD. The metal layer ME may be provided on an opposite surface of the adhesive layer AD opposite to a surface of the adhesive layer AD contacting a first inner side surface 221.

A fluoride resin having excellent insulation properties is included in the fluoride resin layer FR. The anti-static electricity member AS may realize the defects occurrence prevention effect previously described by the fluoride resin layer FR. The fluoride resin layer FR contacts the metal layer ME. The fluoride resin layer FR is spaced apart from the adhesive layer AD. The fluoride resin layer FR is spaced apart from the first sidewall section 220.

When the anti-static electricity member AS includes the adhesive layer AD, the metal layer ME, and the fluoride resin layer FR, the metal layer ME serves as a base member on which the fluoride resin layer FR is coated, and the adhesive layer AD serves to bond a laminate including the metal layer ME and the fluoride resin layer FR to the bottom chassis BC. The fluoride resin layer FR serves to prevent occurrence of defects caused by the ESD as described above.

Figure 5A:
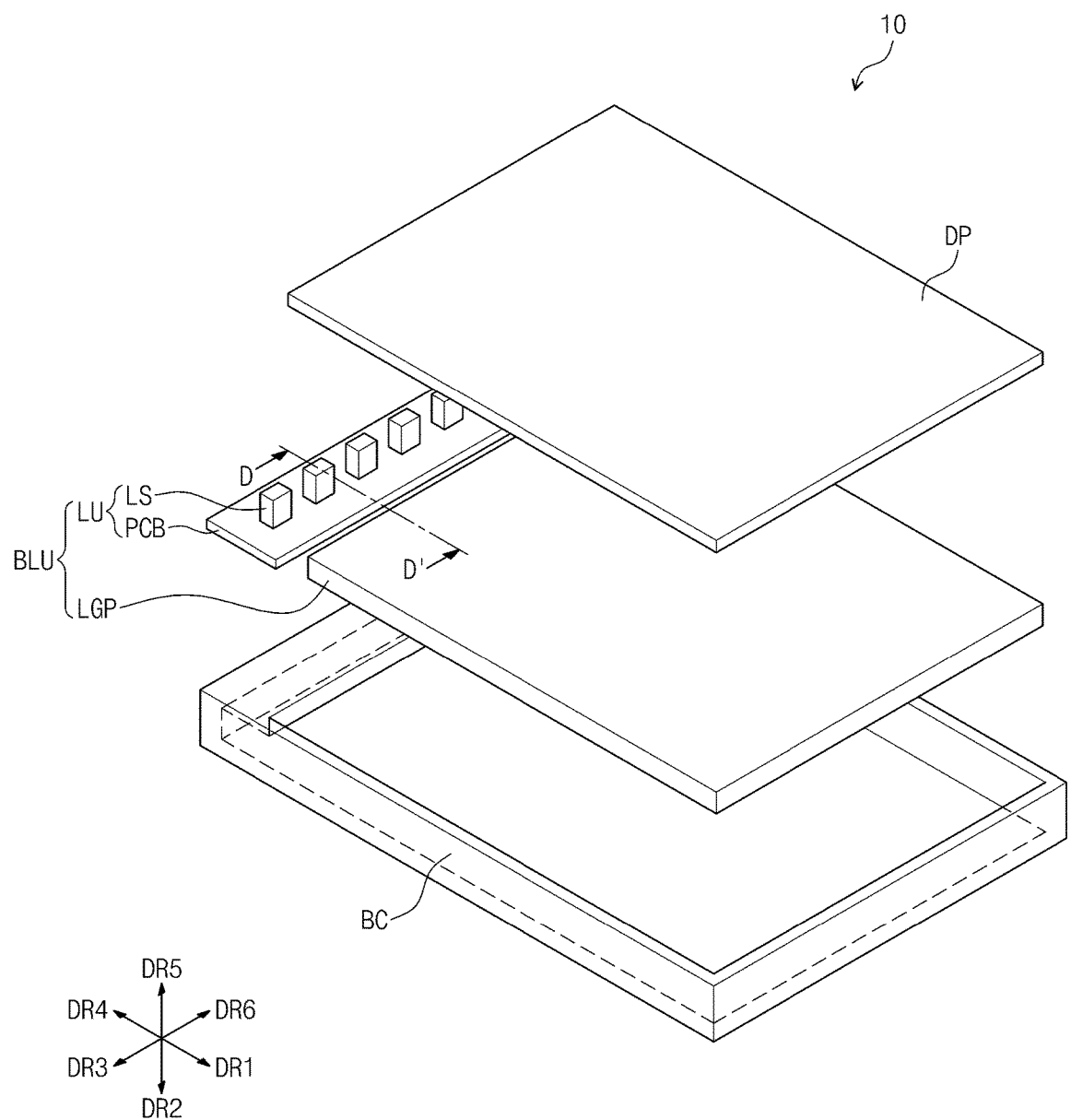
FIG. 5A is a perspective view generally illustrating an exemplary embodiment of a display device according to the invention.
Figure 5B:
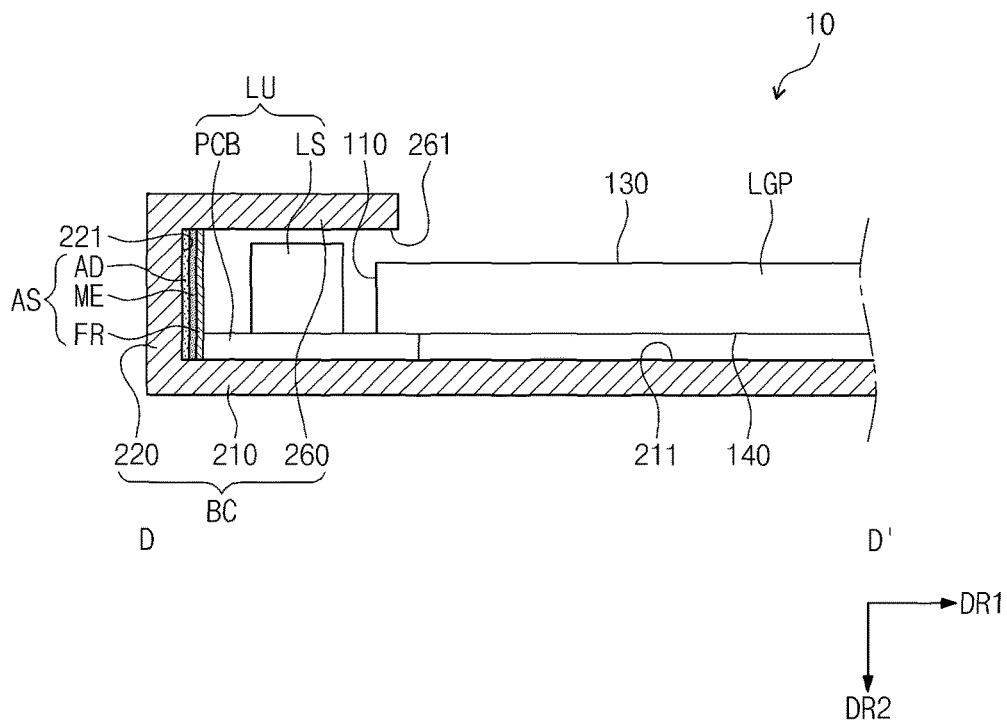
FIG. 5B is a cross-sectional view corresponding to a cross section taken along line D-D' of FIG. 5A.

FIG. 5A is a perspective view illustrating a display device according to an exemplary embodiment of the invention. FIG. 5B is a cross-sectional view taken along line D-D' of FIG. 5A.

Referring to FIGS. 5A and 5B, even when an anti-static electricity member AS includes an adhesive layer AD, a metal layer ME, and a fluoride resin layer FR, a bottom chassis BC may further include a cover section 260. The previous description regarding the cover section 260 will be equally applicable to the cover section 260, and thus a duplicate description will not be provided.

Figure 5C:
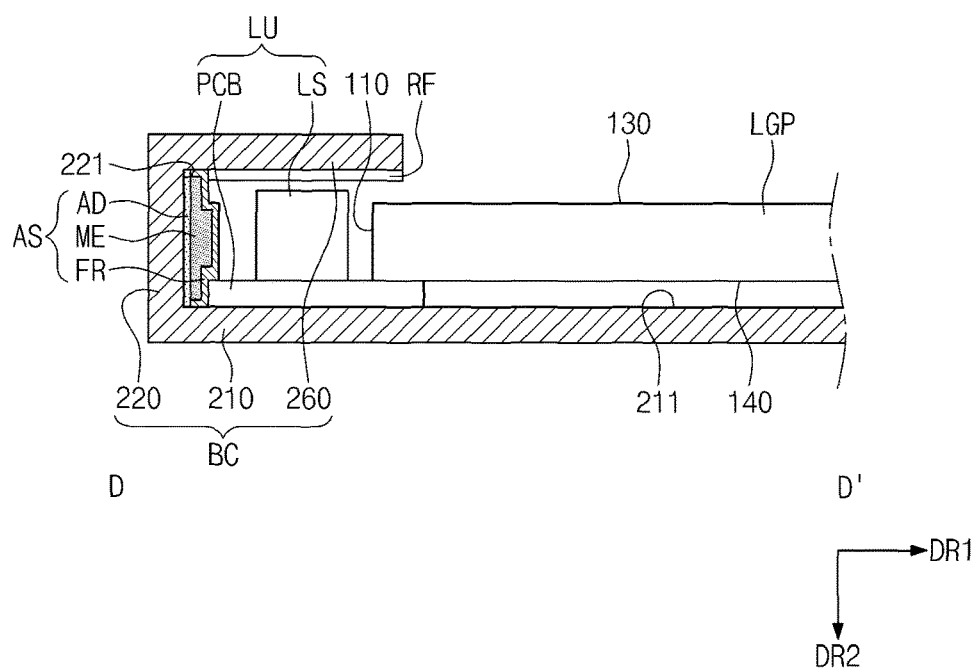
FIG. 5C is a cross-sectional view illustrating a modified example of FIG. 5B.

Shapes of the metal layer ME, the fluoride resin layer FR, and the like are not limited to those illustrated in FIG. 5B. FIG. 5C is a cross-sectional view illustrating a modified example of FIG. 5B. Referring to FIG. 5C, each of the metal layer ME and the fluoride resin layer FR may have a stepped shape.

A reflection member RF may be provided on a cover surface 261 of a cover section 260. The cover surface 261 may be divided into an area in which the anti-static electricity member AS is provided and an area in which the reflection member RF is provided, and the cover surface 261 may not be exposed to the outside by the anti-static electricity member AS and the reflection member RF. However, the exemplary embodiment of the invention is not limited thereto. The reflection member RF serves to reflect light which is not provided to the light incident surface 110 of the light guide plate LGP but leaks out of the light emitted from the light source LS, and serves to provide the reflected light to the light guide plate LGP. Thus, the reflection member RF increases the amount of light that is incident into the light guide plate LGP.

Figure 6A:
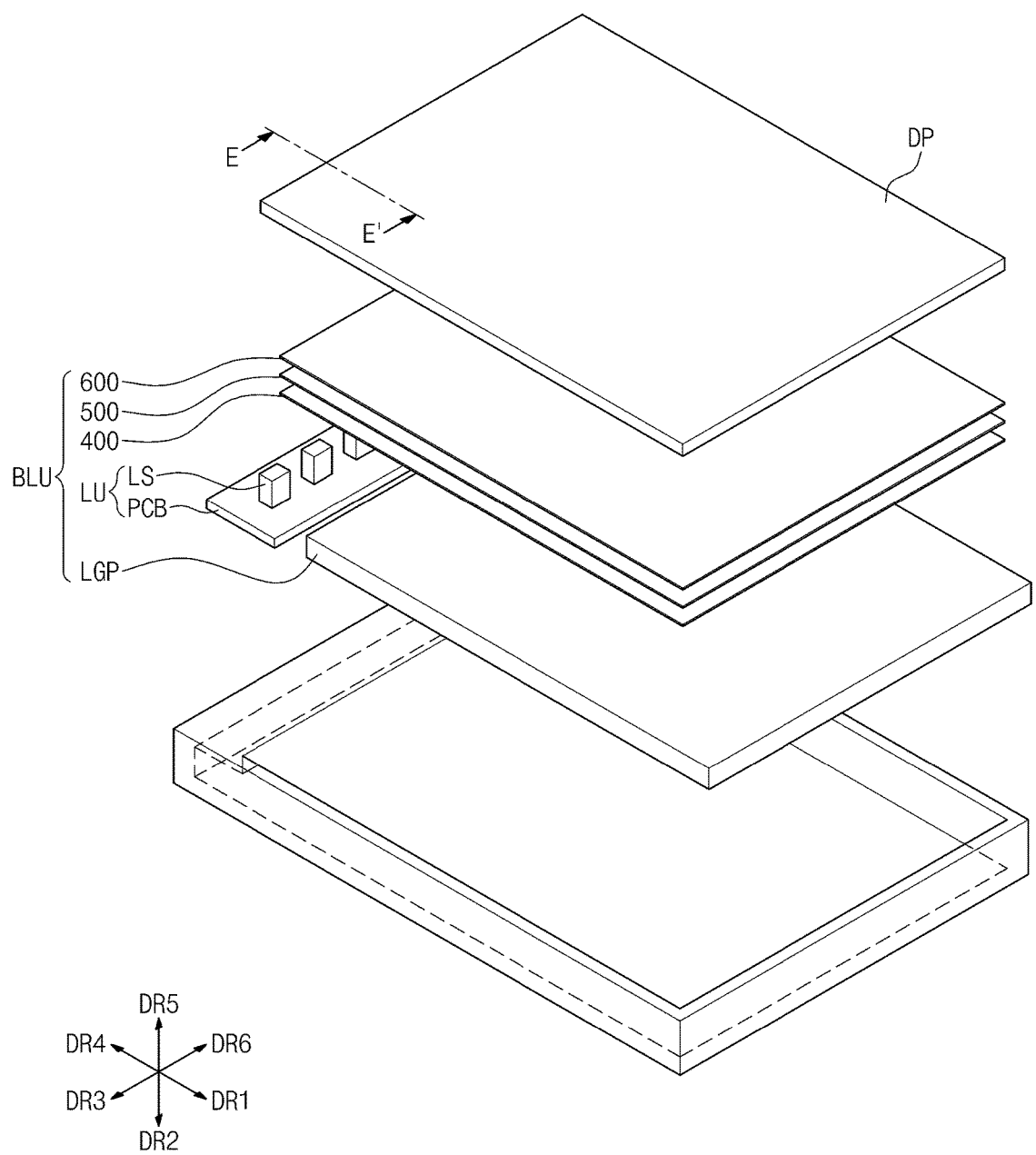
FIG. 6A is a perspective view illustrating an exemplary embodiment of a display device according to the invention.
Figure 6B:
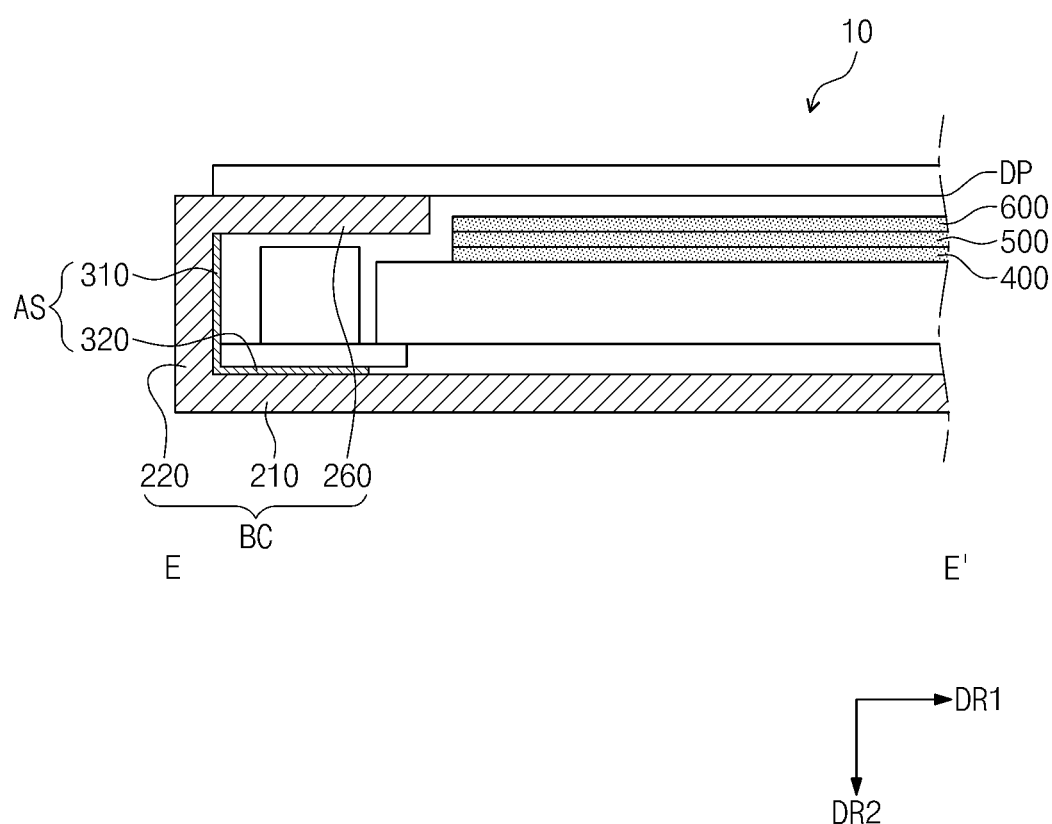
FIG. 6B is a cross-sectional view taken along line E-E' of FIG. 6A.

FIG. 6A is a perspective view illustrating a display device according to an exemplary embodiment of the invention. FIG. 6B is a cross-sectional view taken along line E-E' of FIG. 6A.

Referring to FIGS. 6A and 6B, a backlight unit BLU included in a display device 10 according to an exemplary embodiment of the invention may further include optical members 400, 500, and 600 which are provided on a light guide plate LGP. The optical members improve brightness and viewing angle of light exited through a light exit surface (e.g., 130 of FIG. 1B) of a light guide plate LGP. The optical members may include a first optical member 400, a second optical member 500, and a third optical member 600 which are sequentially laminated. The first, second, and third optical members 400, 500, and 600 may be sequentially laminated in a fifth direction DR5.

In an exemplary embodiment, the first optical member 400 may be a diffusion sheet for diffusing light emitted from the light guide plate LGP. In an exemplary embodiment, the second optical member 500 may be a prism sheet for condensing the light diffused in the diffusion sheet in a direction perpendicular to the plane of the display panel DP provided thereabove. In an exemplary embodiment, the third optical member 600 may be a protection sheet for protecting the prism sheet from an external impact. The optical members 400, 500, and 600 may be used such that at least any one of the first, second, or third optical members 400, 500, or 600 is laminated in a plurality, and one or more sheets may also be omitted, when necessary.

Although not illustrated, the backlight unit BLU may further include a reflection sheet. The reflection sheet may be provided under the light guide plate LGP. The reflection sheet may be provided to a light exit rear surface (e.g., 140 of FIG. 2A) of the light guide plate LGP. The light reflection sheet may be contact a bottom surface (e.g., 211 of FIG. 2A) of a bottom section 210. The reflection sheet reflects light which does not proceed to the display panel DP but leaks to change the path of light such that the light proceed in a direction towards the display panel DP. Thus, the reflection sheet increases the amount of light provided to the display panel DP. The reflection sheet needs to be distinguished from a reflection member (e.g., RF of FIG. 5C) contacting the cover surface 261 of the cover section 260 of the bottom chassis BC.

When the strength of static electricity generated between the light source unit LU and the bottom chassis BC is relatively strong, a spark-jumping phenomenon in which the static electricity jumps and an electrical conduction is generated in spite of the presence of an insulation pattern or the like is observed. Thus, the display device 10 according to an exemplary embodiment of the invention has an advantage of achieving properties of essentially insulating the ESD by including the anti-static electricity member AS contacting the bottom chassis BC. The display device 10 according to an exemplary embodiment of the invention has the advantage of fundamentally preventing occurrence of defects caused by the ESD by providing the anti-static electricity member AS including a fluoride resin having excellent insulation properties to an entire area in which the ESD occurs. Further, as the fluoride resin has excellent chemical resisting properties, heat resisting properties, and waterproofing properties as well as insulation properties, the display device 10 according to an exemplary embodiment of the invention also has the advantage that reliability thereof may be improved by including the anti-static electricity member AS including the fluoride resin.

Defects caused by ESD may be prevented from occurring by a display device according to an exemplary embodiment of the invention. More particularly, the occurrence of defects caused by the ESD generated between a bottom chassis and a backlight unit may be prevented by the display device according to an exemplary embodiment of the invention.

The display device according to an exemplary embodiment of the invention may improve the reliability thereof by providing an anti-static electricity member having excellent chemical resistance properties, heat resistance properties, insulation properties, and waterproof properties to the bottom chassis.

While the invention has been particularly shown and described with reference to exemplary embodiments thereof, it will be understood by those skilled in the art that various changes in form and details may be made therein without departing from the spirit and scope of the invention as defined by the appended claims. Therefore, it should be understood that the invention is exemplified in all exemplary embodiments in embodiments described as above in all exemplary embodiments, but not limited thereto. Therefore, the exemplary embodiments set forth herein have been exemplified in all exemplary embodiments and should not be understood as limiting the invention.

What is claimed is:

1. A display device comprising:
   a light source unit;
   a light guide plate including a light incident surface which receives light from the light source unit, an opposite surface facing the light incident surface, a light exit surface which connects the light incident surface and the opposite surface to each other, and a light exit rear surface facing the light exit surface;
   a display panel provided on the light exit surface;
   a bottom chassis which houses the light guide plate therein; and
   an anti-static electricity member including a fluoride resin and contacting the bottom chassis,
   wherein the bottom chassis comprises a bottom section and a sidewall section,
   wherein the sidewall section comprises:
   a first sidewall section more adjacent to the light incident surface than the opposite surface;
   a second sidewall section facing the first sidewall section;
   a third sidewall section which connects the first and second sidewall sections to each other; and
   a fourth sidewall section facing the third sidewall section, and
   wherein the anti-static electricity member is provided between opposing facing surfaces defining the first sidewall section and the light source unit, and contacts at least a portion of the first sidewall section.

2. The display device of claim 1, wherein the fluoride resin comprises one of polytetrafluoroethylene ("PTFE"), perfluoroalkoxy ("PFA"), fluorinated ethylene propylene ("FEP"), ethylene tetrafluoroethylene ("ETFE"), ethylene-chlorotrifluoroethylene ("ECTFE"), and any combination thereof.

3. The display device of claim 1, wherein the first sidewall section comprises a first inner side surface on which the anti-static electricity member is provided and which is not exposed to an outside by the anti-static electricity member.

4. The display device of claim 1, wherein the anti-static electricity member comprises:
   a first sub-anti-static electricity member contacting the at least the portion of the first sidewall section; and
   a second sub-anti-static electricity member contacting at least a portion of the bottom section.

5. The display device of claim 4, wherein the first and second sub-anti-static electricity members are unitary.

6. The display device of claim 5, wherein the light source unit comprises:
   a printed circuit board; and
   a light source provided on the printed circuit board,
   wherein the printed circuit board is provided on the bottom section, and
   wherein the second sub-anti-static electricity member is provided between the bottom section and the printed circuit board, and contacts each of the bottom section and the printed circuit board.

7. The display device of claim 1, wherein the bottom chassis further comprises a cover section which perpendicularly extends from the first sidewall section and is opposed to the bottom section.

8. The display device of claim 7, wherein the cover section overlaps a portion of the bottom section when viewed in a plane.

9. The display device of claim 7, wherein the anti-static electricity member comprises:
   a first sub-anti-static electricity member contacting the at least the portion of the first sidewall section;
   a second sub-anti-static electricity member contacting at least a portion of the bottom section; and
   a third sub-anti-static electricity member contacting at least a portion of the cover section.

10. The display device of claim 9, wherein the first, second, and third sub-anti-static electricity members are unitary.

11. The display device of claim 1, wherein the anti-static electricity member comprises:
    an adhesive layer contacting the at least a portion of the first sidewall section;
    a metal layer spaced apart from the first sidewall section and contacting the adhesive layer; and
    a fluoride resin layer including the fluoride resin and contacting the metal layer.

12. The display device of claim 11, wherein the light source unit comprises a printed circuit board and a light source provided on the printed circuit board, and
    wherein the printed circuit board contacts the bottom section.

13. The display device of claim 12, wherein one end of the printed circuit board contacts a portion of the fluoride resin layer.

14. The display device of claim 1, wherein the anti-static electricity member is spaced apart from the second sidewall section.

15. The display device of claim 1, wherein the anti-static electricity member has a thickness in a range from about 50 micrometers to about 70 micrometers.

16. The display device of claim 1, wherein the bottom chassis comprises a conductive material.

* * * * *